United States Patent
Moon et al.

(10) Patent No.: US 9,192,083 B2
(45) Date of Patent: Nov. 17, 2015

(54) ELECTRONIC COMPONENT BOX FOR VEHICLE

(71) Applicant: LSIS CO., LTD., Anyang-si, Gyeonggi-do (KR)

(72) Inventors: Ki Young Moon, Cheonan-si (KR); Young Min Kim, Seoul (KR); Hyoung Taek Kim, Daejeon (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 280 days.

(21) Appl. No.: 13/892,063

(22) Filed: May 10, 2013

(65) Prior Publication Data

US 2014/0009886 A1    Jan. 9, 2014

(30) Foreign Application Priority Data

Jul. 5, 2012 (KR) .................. 10-2012-0073173

(51) Int. Cl.
*H05K 7/20* (2006.01)
*H05K 9/00* (2006.01)
*H01L 23/473* (2006.01)

(52) U.S. Cl.
CPC .......... *H05K 9/0007* (2013.01); *H05K 7/20254* (2013.01); *H05K 9/002* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459
See application file for complete search history.

(56) References Cited

U.S. PATENT DOCUMENTS 6,055,158 A * 4/2000 Pavlovic ............ H05K 7/20509
165/80.2
6,108,202 A * 8/2000 Sumida ............... B60R 16/0238
361/690

(Continued)

FOREIGN PATENT DOCUMENTS

CN    101960706    1/2011
JP    04-119304    4/1992

(Continued)

OTHER PUBLICATIONS

Korean Intellectual Property Office Application Serial No. 10-2012-0073173, Office Action dated Sep. 2, 2013, 6 pages.

(Continued)

*Primary Examiner* — Anthony Haughton
*Assistant Examiner* — Razmeen Gafur
(74) *Attorney, Agent, or Firm* — Lee, Hong, Degerman, Kang & Waimey

(57) ABSTRACT

Provided is an electronic component box for a vehicle. The electronic component box for a vehicle, the electronic component box including a housing formed of a plastic material and manufactured through plastic injection molding, the housing having an opened top surface, a top cover formed of a plastic material and manufactured through the plastic injection molding, the top cover covering the opened top surface of the housing, a base cover seated on a bottom surface of the housing, an electronic component set seated on a top surface of the base cover, and an inner cover accommodated within the housing, the inner cover covering the electronic component set to shield an electromagnetic wave emitted from the electronic component set.

11 Claims, 5 Drawing Sheets

(56) References Cited

U.S. PATENT DOCUMENTS

| | | | | |
|---|---|---|---|---|
| 6,404,628 B1* | 6/2002 | Nagashima | H05K 7/20927 | 165/104.33 |
| 6,713,675 B2* | 3/2004 | Lukas | G06F 1/183 | 174/559 |
| 6,801,431 B2* | 10/2004 | Hartke | G06F 1/18 | 165/185 |
| 8,113,009 B2* | 2/2012 | Kuriyama | H05K 7/20745 | 361/696 |
| 9,000,582 B2* | 4/2015 | Hiramitsu | H01L 21/52 | 257/140 |
| 2003/0133267 A1* | 7/2003 | Beihoff | B60L 11/12 | 361/704 |
| 2005/0068735 A1* | 3/2005 | Fissore | H01L 23/047 | 361/702 |
| 2005/0270745 A1* | 12/2005 | Chen | H01F 27/2804 | 361/707 |
| 2006/0018098 A1* | 1/2006 | Hill | H05K 1/0204 | 361/708 |
| 2007/0165376 A1* | 7/2007 | Bones | H01L 25/162 | 361/688 |
| 2007/0183128 A1* | 8/2007 | Pirillis | H05K 9/0058 | 361/715 |
| 2008/0117602 A1* | 5/2008 | Korich | H01G 2/08 | 361/715 |
| 2009/0185346 A1* | 7/2009 | Cairo | H05K 7/2089 | 361/692 |
| 2010/0014250 A1* | 1/2010 | Kitahara | A61B 8/546 | 361/695 |
| 2010/0097765 A1* | 4/2010 | Suzuki | B60K 6/365 | 361/699 |
| 2010/0157544 A1* | 6/2010 | Tsao | H05K 9/0032 | 361/720 |
| 2010/0166211 A1* | 7/2010 | Snider | H04B 1/082 | 381/86 |
| 2010/0238627 A1* | 9/2010 | Shinohara | H01L 23/3107 | 361/695 |
| 2011/0051371 A1* | 3/2011 | Azuma | B60K 6/445 | 361/699 |
| 2011/0192568 A1* | 8/2011 | Hsieh | H05K 7/20927 | 165/48.1 |
| 2012/0008286 A1* | 1/2012 | Suzuki | B60L 11/14 | 361/730 |
| 2012/0140417 A1* | 6/2012 | Aspas Puertolas | H05K 7/2049 | 361/709 |
| 2012/0147565 A1* | 6/2012 | I | H05K 7/20427 | 361/720 |

FOREIGN PATENT DOCUMENTS

| | | |
|---|---|---|
| JP | 09-331178 | 12/1997 |
| JP | 2010-192759 | 9/2010 |
| KR | 10-2005-0120435 | 12/2005 |
| KR | 10-2011-0139038 | 12/2011 |

OTHER PUBLICATIONS

Japan Patent Office Application Serial No. 2013-124765, Office Action dated Mar. 11, 2014, 2 pages.

The State Intellectual Property Office of the People's Republic of China Application Serial No. 201310277353.1 Office Action dated Sep. 1, 2015, 7 pages.

* cited by examiner

ELECTRONIC COMPONENT BOX FOR VEHICLE

CROSS-REFERENCE TO RELATED APPLICATIONS

Pursuant to 35 U.S.C. §119(a) this application claims the benefit of earlier filing date and right of priority to Korean Patent Application No. 10-2012-0073173, filed on Jul. 5, 2012, the contents of which is incorporated by reference herein in its entirety.

BACKGROUND

The present disclosure relates to an electronic component box for vehicles.

Recently, technologies with respect to electric vehicles driven by using electricity that is green energy are being rapidly developed. Most of electric vehicles include a motor generating torque, a battery supplying a power to the motor, an inverter controlling the number of revolution of the motor, a battery charger charging electricity into the battery, and a low voltage DC/DC converter for vehicles.

The electronic components generate a large amount of heat and a lot of electromagnetic waves or noises that have an influence on operations of other electronic components during the operation thereof. To solve the above-described limitations, the electronic compounds are accommodated within an electronic compound box that has an air cooling type or water cooling type heat-dissipation structure and a shield function shielding EMI electromagnetic waves to satisfy electro magnetic compatibility (EMC).

FIG. 1 is an exploded perspective view of an electronic component box for a vehicle according to a related art.

Referring to FIG. 1, an electronic component box 1 for a vehicle according to the related art includes a bottom cover 2 having a cooling passage in a top surface thereof, a housing 3 fixed to the top surface of the bottom cover 2 to accommodate all sorts of electronic components therein, a top cover 4 covering an opened top surface of the housing, an upper sealer 6 disposed between contact portions of the top cover 4 and the housing 3 to perform a sealing function, and a lower sealer 5 disposed between contact portions of the bottom cover 2 and the housing 3 to perform a sealing function.

The above-described electronic component box according to the related art adopts a water cooling type heat-dissipation method. Here, a cooling passage through which coolant flows is defined in an outer bottom surface of the housing 3 by the bottom cover 2.

Also, the housing 3 and top cover 4 is formed of a steel plate cold commercial (SPCC) or aluminum steel to shield the electromagnetic waves to improve cooling efficient and EMS stability.

However, in the case of the electronic component box product according to the related art, since the housing shielding the electronic components are formed of metallic materials including iron or aluminum to increase a weight of the electronic component box and reduce fabricating price competitiveness. Furthermore, when the electronic component box is increased in weight, a self-weight of the vehicle is increased to increase an electrical energy consumption.

SUMMARY

Embodiments provide an electronic component box for a vehicle of which a self-weight decreases, but cooling efficiency and electromagnetic wave shielding function are maintained or improved.

Embodiments also provide an electronic component box for a vehicle. The electronic component box including: a housing formed of a plastic material and manufactured through plastic injection molding, the housing having an opened top surface; a top cover formed of a plastic material and manufactured through the plastic injection molding, the top cover covering the opened top surface of the housing; a base cover seated on a bottom surface of the housing; an electronic component set seated on a top surface of the base cover; and an inner cover accommodated within the housing, the inner cover covering the electronic component set to shield an electromagnetic wave emitted from the electronic component set.

The details of one or more embodiments are set forth in the accompanying drawings and the description below. Other features will be apparent from the description and drawings, and from the claims.

DETAILED DESCRIPTION OF THE EMBODIMENTS

In the following detailed description of the preferred embodiments, reference is made to the accompanying drawings that form a part hereof, and in which is shown by way of illustration specific preferred embodiments in which the invention may be practiced. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

Hereinafter, an electronic component box for a vehicle, particularly, an electrical vehicle according to embodiments will be described in detail with reference to the accompanying drawings.

Figure 1:
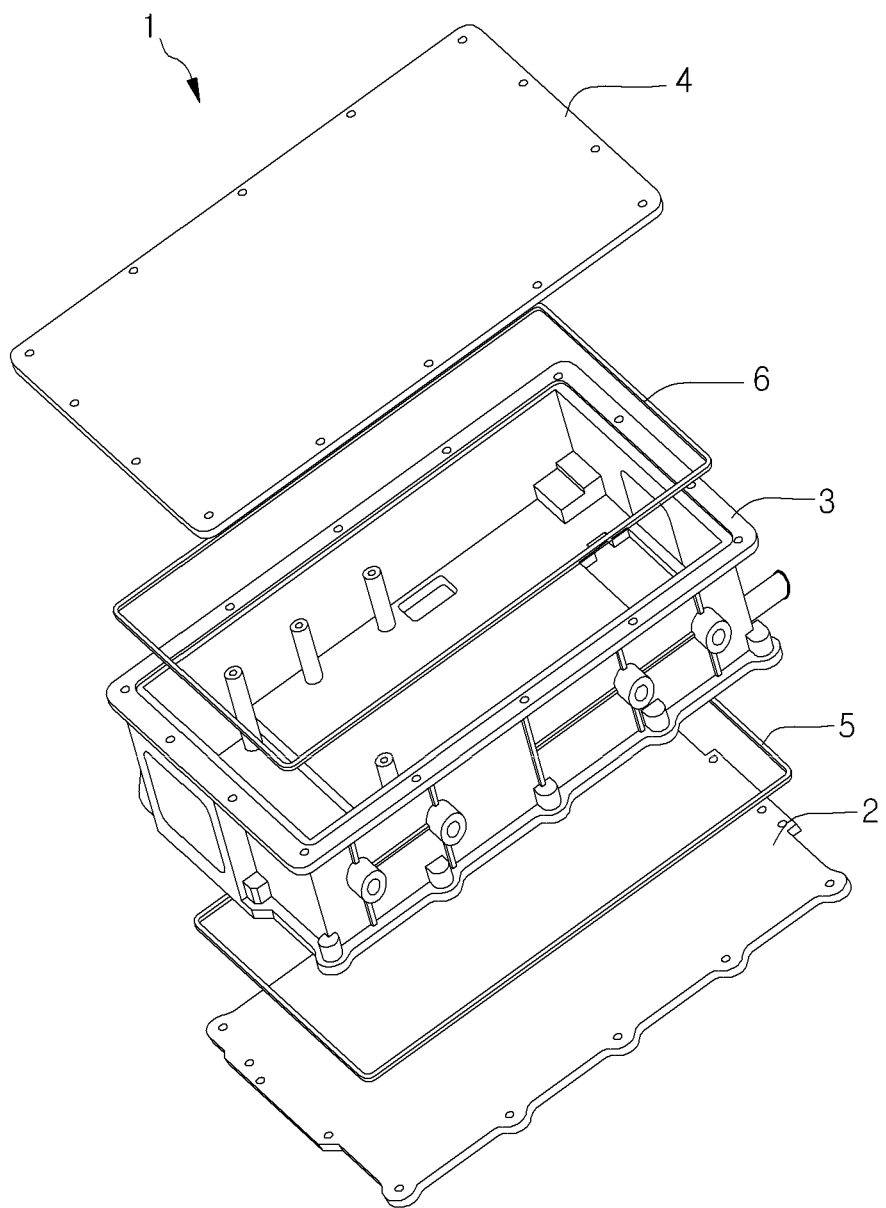
FIG. 1 is an exploded perspective view of an electronic component box for a vehicle according to a related art.
Figure 2:
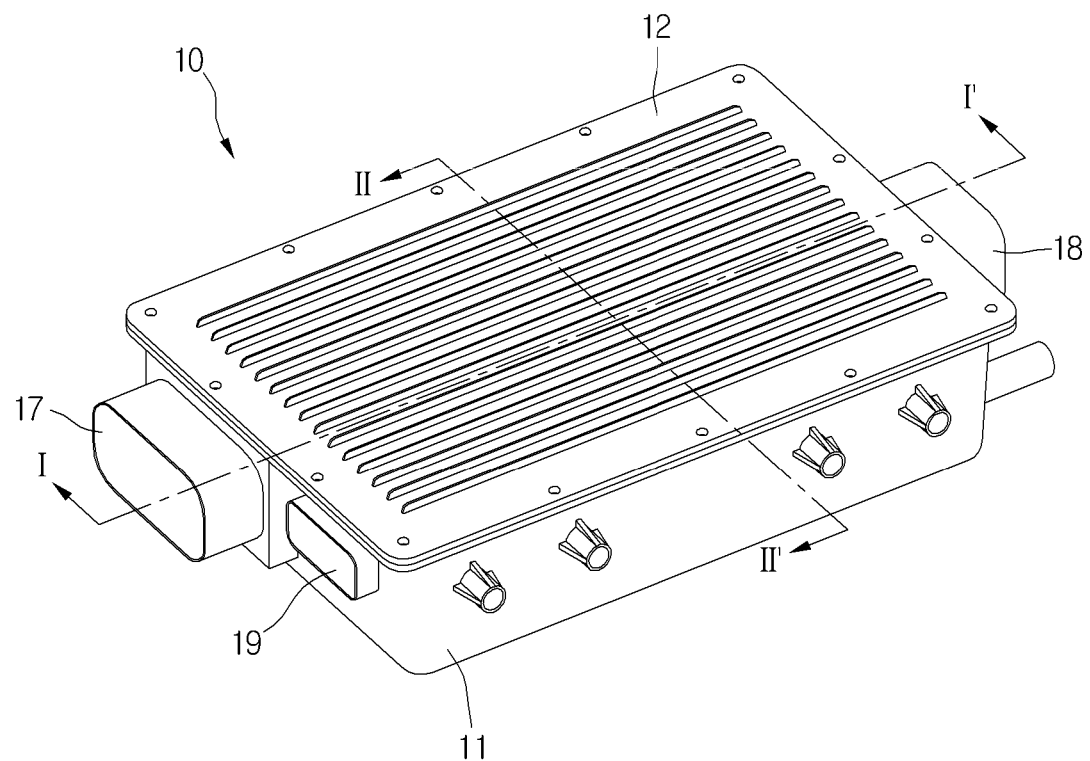
FIG. 2 is a perspective view illustrating an outer appearance of an electronic component box according to an embodiment.
Figure 3:
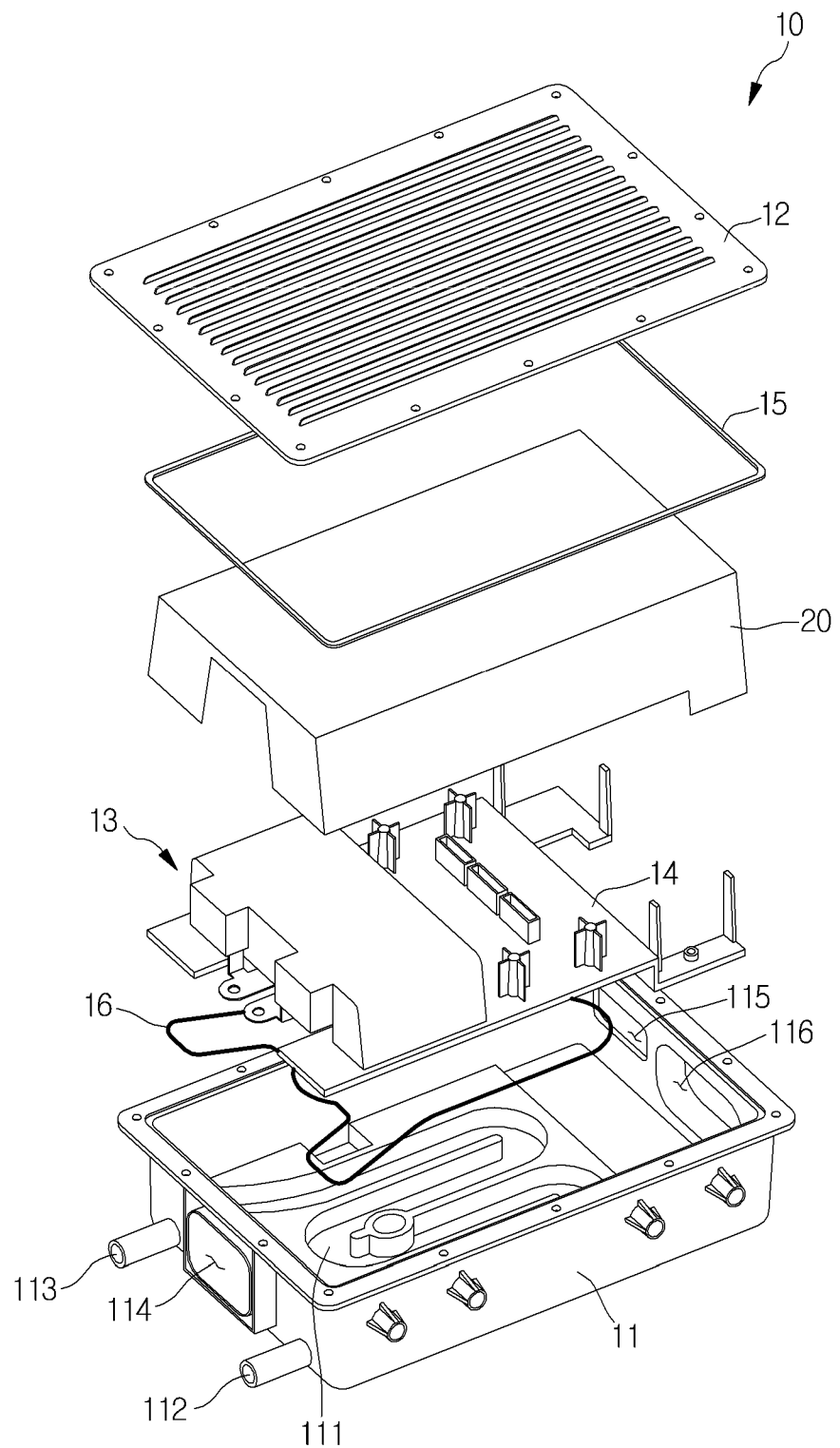
FIG. 3 is an exploded perspective view of the electronic component box.
Figure 4:
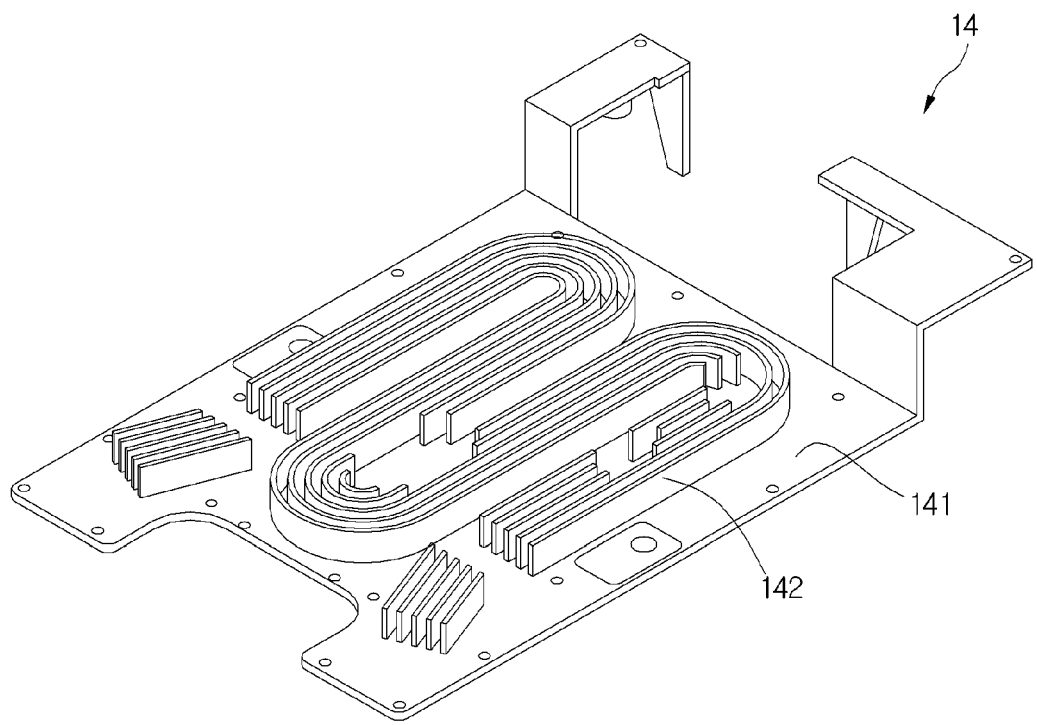
FIG. 4 is a bottom view of a base cover disposed within the electronic component box.
Figure 5:
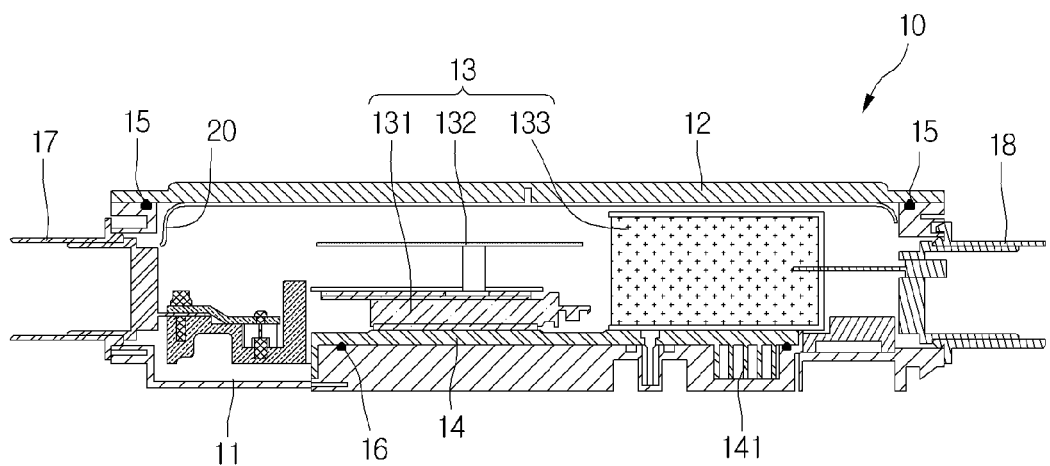
FIG. 5 is a cross-sectional view taken along line I-I' of FIG. 2.
Figure 6:
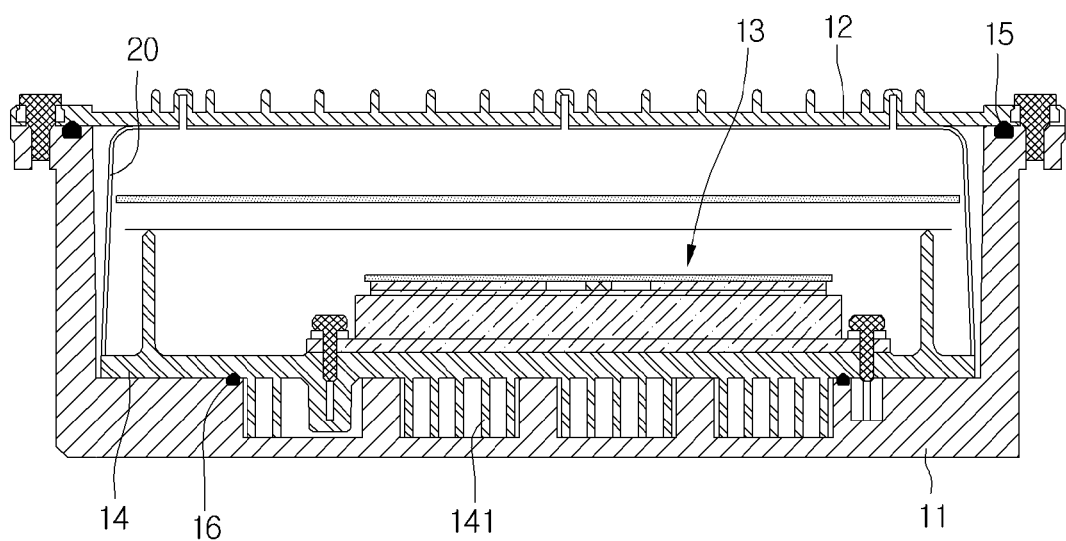
FIG. 6 is a cross-sectional view taken along line II-II' of FIG. 2.

FIG. 2 is a perspective view of an outer appearance of an electronic component box according to an embodiment. FIG. 3 is an exploded perspective view of the electronic component box. FIG. 4 is a bottom view of a base cover disposed within the electronic component box. FIG. 5 is a cross-sectional view taken along line I-I' of FIG. 2. FIG. 6 is a cross-sectional view taken along line II-II' of FIG. 2.

Referring to FIGS. 2 to 6, an electronic component box 10 according to the embodiment may include an inverter, LDC, or an on-board charger (OBC).

In detail, the electronic component box 10 includes a housing 11 defining an outer appearance thereof and having an opened top surface, a top cover 12 covering the opened top surface of the housing 11, a power-in connector 18 mounted on one surface of the housing 11, a power-out connector 17 mounted on the other side of the housing 11, a signal connector 19, an electronic component set 13 accommodated within the housing 11, a base cover 14 on which the electronic component set 13 is seated, an inner cover 20 covering the electronic component set 13 and in which a lower end thereof is closely attached to the base cover 14, a first sealer 15 surrounded along contact surfaces of the top cover 12 and housing 11 to a waterproof function, and a second sealer 16 disposed between contact surfaces of the base cover 14 and the housing 11 to perform a waterproof function.

An in-connector hole 114 in which the power-in connector 18 is mounted is defined in one side surface of the housing 11. Also, an out-connector hole 116 in which the power-out connector 19 is mounted and a signal connector hole 115 in which the signal connector 19 is mounted are defined in the other side surface. The signal connector hole 115 may be defined in any one of one side surface and the other surface of the housing 11.

Also, a cooling passage 111 through which coolant flow is defined in a bottom surface of the housing 11 in a meander line shape. Also, a coolant inflow port 112 into which coolant is introduced and a coolant discharge port 113 through which the coolant is discharged are disposed on a side surface of the housing 11. The coolant inflow port 112 and the coolant discharge port 113 may respectively communicate with an inlet and outlet of the cooling passage 111. Thus, the coolant introduced through the coolant inflow port 112 flows along the cooling passage 111 to cool the electronic component set 13 seated on a top surface of the base cover 14. Here, the electronic components generating a relatively large amount of heat are disposed on a position close to the inlet of the cooling passage 111, and the electronic components generating a relatively small amount of heat are disposed on a position close to the outlet of the cooling passage 111 to improve heat exchange efficiency.

Also, the second sealer 16 is seated along an outer line of a top surface of the cooling passage 111, and the base cover 14 is seated on the second sealer 16 to prevent the coolant flowing along the cooling passage 111 from leaking toward the electronic component set 13. The first sealer 15 is seated along an edge of the top surface of the housing 111, and the top cover 12 is seated on the first sealer 15 to prevent water or foreign materials from being introduced into the housing 11 from the outside.

Also, as shown in FIG. 4, the base cover 14 includes a cover body 141 and a plurality of cooling pins 142. The cover body 141 covers the cooling passage 111, and the plurality of cooling pins protrude from a back surface of the cover body 141, particularly, a back surface of a portion corresponding to an inner space of the cooling passage 111. When the base cover 14 is seated, the plurality of cooling pins 142 may be rounded along a profile of the cooling passage 111. The plurality of cooling pins 142 are spaced a predetermined distance from each other to heat-exchange with the coolant flowing along the cooling passage through heat conduction. That is, heat generated from the electronic component set 13 may be transferred into the coolant through the plurality of cooling pins 142.

Also, the electronic component set 13 may include a switching device 131 including an insulated gate bipolar mode transistor (IGBT) that switches a DC voltage to output a three-phase current voltage, a DC link cap 133 mounted on a side of the top surface of the base cover 14 to stabilize an input voltage and reduce noises of the switching device 131, and a power PCB 132. In addition, the electronic component set 13 may further include various electronic components that are not described herein.

Each of the housing 11 and the top cover 12 may be formed of a light plastic material through plastic injection molding using a plastic resin. The housing 11 and the top cover 12 are formed of the plastic materials to decrease a weight thereof and improve price competitiveness when compared to those formed of an existing iron or aluminum material. However, in the case where the housing 11 and the top cover 12 are formed of the plastic materials, electromagnetic waves generated from the electronic component set 13 may not be effectively shield.

To solve this limitation, the inner cover 20 may be formed of the same material as the housing 11, that is, an aluminum or iron material to shield the electromagnetic waves. Like this, the base cover 14 may be a metal plate formed of aluminum to shield electromagnetic waves and transfer heat.

Alternatively, a plastic member manufactured by the plastic injection molding may be applied to the inner cover 20, and a plating process using nickel (Ni) or chromium (Cr) may be performed on an inner surface of at least the inner cover 20 to shield the electromagnetic waves. Since the plating process using the Ni or Cr is performed on the inner surface of the inner cover, the electromagnetic waves emitted from the electronic component set 13 may be effectively shielded. The plated layer may have a minimum thickness in a case where copper (Cu) is plated to a thickness of about 15 μm, nickel (Ni) is plated to a thickness of about 10 μm, and chromium (Cr) is to with a thickness of about 0.2 μm. On the other hand, the plated layer may have a maximum thickness in a case where copper (Cu) is plated to a thickness of about 20 μm, nickel (Ni) is plated to a thickness of about 15 μm, and chromium (Cr) is plated to a thickness of about 0.3 μm. The Cu, Ni, and Cr plated layers may be successively formed within a range of the maximum thickness and the minimum thickness.

In addition, in the case of the existing electronic component box, since the cooling passage and the cooling pin protrude from the outer bottom surface of the housing, and an opening of the bottom surface of the cooling path is covered by a separate bottom cover, the electronic component box has no choice but to increase a thickness thereof. Furthermore, the coolant leaks from the cooling passage, and thus other components of the vehicle may corrode with the coolant. However, according to the embodiment, the cooling passage 111 may be defined in the inner bottom surface of the housing, and the top surface of the cooling passage 111 may be covered by the base cover 14. When the electronic component 10 is mounted within the vehicle, the opened top surface of the cooling passage 111 faces an upper side to prevent the coolant from leaking through the top surface of the cooling passage.

Also, in the case of the existing electronic component, since the cooling passage is defined in the outer bottom surface of the housing, and a separate plate on which the electronic component is seated is seated on the inner bottom surface of the housing, cooling efficient may be reduced. However, according to the embodiment, since the base cover 14 is seated on the top surface of the cooling passage, and the electronic component set 13 is seated on the top surface of the cover base 14, the heat-exchange efficiency may increase. That is, if heat discharged from the electronic component set 13 passes through only the base cover 14, since the heat may directly heat-exchange with the coolant, the heat-exchange efficient may significantly increase when compared to a double bottom structure according to the related art.

Also, since the aluminum, the steel plate cold commercial (SPCC), or different kinds of metal plate which shields the electromagnetic waves and has high heat conductivity is applied as the material of the base cover 14, it is not necessary to perform a separate plating process onto the bottom portion of the housing 11 covered by the base cover 14. Thus, the plating processing costs may be reduced.

The above-described the electronic component box according to the embodiments has following effects.

First, since the portion of the electronic component is formed of the plastic material through using the plastic injection molding, the self-weight of the electronic component box may decrease.

Second, the separate cover of which the surface is coated with nickel (Ni) or chromium (Cr) is used for shielding the electromagnet waves so that the electromagnet shielding function may be maintained or improved.

Third, cooling passage is disposed in the housing of the electromagnet component box to decrease the thickness of the electromagnet component box. Thus coolant is not leaked from the electromagnet component box to prevent the corrosion of the other parts of the electromagnet component box and the electrical short circuit.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electronic component box for a vehicle, the electronic component box comprising:
   a housing formed of a plastic material, the housing including:
      a rectangular bottom side and four outer side walls extending from the bottom side;
      a cooling passage recessed in the bottom side;
      a coolant inflow port disposed at a first of the four outer side walls and configured to communicate with a first end of the cooling passage;
      a coolant discharge port disposed at the first outer side wall and configured to communicate with a second end of the cooling passage;
   a top cover formed of a plastic material disposed at an opening defined by the four outer side walls opposite the bottom side;
   a base cover seated on the bottom side and including:
      a cover body disposed on the bottom side to cover the recessed cooling passage; and
      a plurality of cooling pins protruding from the cover body into the cooling passage and configured to transfer heat to coolant flowing through the cooling passage;
   a first sealer positioned between an edge of the cooling passage and the base cover;
   a second sealer positioned between an edge defined by the four outer side walls and the top cover;
   an electronic component set seated on the base cover; and
   an inner cover accommodated within the housing and including:
      a rectangular upper side and four inner side walls extending from the upper side, wherein the four inner side walls are configured to contact the base cover to enclose the electronic component set to shield electromagnetic waves emitted from the electronic component set.

2. The electronic component box according to claim 1, wherein the inner cover is formed of a metal including at least aluminum or iron.

3. The electronic component box according to claim 1, wherein the base cover is formed of a metal including at least aluminum or iron capable of conducting heat.

4. The electronic component box according to claim 1, wherein the inner cover is formed of plastic, and
   the electronic component box further comprises a plated layer for shielding the electromagnetic waves.

5. The electronic component box according to claim 4, wherein the plated layer comprises a metal plated layer in which a copper (Cu) plated layer is coated with one or all of chromium (Cr) and nickel (Ni).

6. The electronic component box according to claim 5, wherein the copper (Cu) plated layer has a thickness ranging from about 15 μm to about 20 μm.

7. The electronic component box according to claim 6, wherein the chromium (Cr) plated layer has a thickness ranging from about 0.2 μm to about 0.3 μm.

8. The electronic component box according to claim 5, wherein the nickel (Ni) plated layer has a thickness ranging from about 10 μm to about 15 μm.

9. The electronic component box according to claim 8, wherein the chromium (Cr) plated layer has a thickness ranging from about 0.2 μm to about 0.3 μm.

10. The electronic component box according to claim 1, wherein a top side of the inner cover contacts a lower side of the top cover.

11. The electronic component box according to claim 1, wherein the cooling passage is configured with a winding shape and the plurality of cooling pins are positioned to correspond to the winding shape.

* * * * *